(12) United States Patent
Kim et al.

(10) Patent No.: US 7,476,610 B2
(45) Date of Patent: Jan. 13, 2009

(54) REMOVABLE SPACER

(75) Inventors: Ji Soo Kim, Pleasanton, CA (US); Conan Chiang, Los Altos, CA (US); Daehan Choi, Sunnyvale, CA (US); S. M. Reza Sadjadi, Saratoga, CA (US); Michael Goss, Mendon, MA (US)

(73) Assignee: Lam Research Corporation, Fremont, CA (US)

( * ) Notice: Subject to any disclaimer, the term of this patent is extended or adjusted under 35 U.S.C. 154(b) by 245 days.

(21) Appl. No.: 11/598,242

(22) Filed: Nov. 10, 2006

(65) Prior Publication Data

US 2008/0111166 A1    May 15, 2008

(51) Int. Cl.
*H01L 21/44* (2006.01)

(52) U.S. Cl. ............... 438/628; 438/637; 438/639; 438/695; 438/710; 438/759; 257/E21.038; 257/E21.039; 257/E21.252; 257/E21.507; 257/E21.549

(58) Field of Classification Search ......... 438/253–256, 438/296, 297, 396, 398, 400, 637, 639, 695, 438/696, 706, 710, 759, 780, 978; 257/E21.038, 257/E21.039, E21.252, E21.507, E21.529, 257/E21.549

See application file for complete search history.

(56) References Cited

U.S. PATENT DOCUMENTS

| | | | |
|---|---|---|---|
| 5,801,077 A | | 9/1998 | Chor et al. |
| 5,801,083 A | * | 9/1998 | Yu et al. ............. 438/424 |
| 5,882,535 A | * | 3/1999 | Stocks et al. ............. 216/18 |
| 6,103,588 A | * | 8/2000 | Jeng et al. ............. 438/399 |
| 6,562,696 B1 | * | 5/2003 | Hsu et al. ............. 438/424 |
| 6,566,280 B1 | * | 5/2003 | Meagley et al. ............. 438/780 |
| 7,045,408 B2 | | 5/2006 | Hoffmann et al. |
| 7,235,478 B2 | * | 6/2007 | Geng et al. ............. 438/634 |

FOREIGN PATENT DOCUMENTS

| | | |
|---|---|---|
| JP | 03-040437 A | 2/1991 |
| JP | 09-027620 A | 1/1997 |
| KR | 10-1997-0018253 A | 1/2002 |

OTHER PUBLICATIONS

International Search Report dated Apr. 18, 2008 from International Application No. PCT/US2007/082723.
Written Opinion dated Apr. 18, 2008 from International Application No. PCT/US2007/082723.

* cited by examiner

*Primary Examiner*—Michael S Lebentritt
(74) *Attorney, Agent, or Firm*—Beyer Law Group LLP

(57) ABSTRACT

A method for forming semiconductor devices is provided. A gate stack is formed over a surface of a substrate. A plurality of cycles for forming polymer spacers on sides of the gate stack is provided, where each cycle comprises providing a deposition phase that deposits material on the sides of the polymer spacer and over the surface of the substrate, and providing a cleaning phase that removes polymer over the surface of the substrate and shapes a profile of the deposited material. Dopant is implanted into the substrate using the polymer spacers as a dopant mask. The polymer spacers are removed.

19 Claims, 6 Drawing Sheets

REMOVABLE SPACER

BACKGROUND OF THE INVENTION

The invention relates to the formation of semiconductor devices.

In the formation of CMOS devices, a gate stack is formed over a channel. Spacers may be formed on the sides of the gate stacks, so that the spacers may be used as implant masks and dimensional spacing layers.

SUMMARY OF THE INVENTION

To achieve the foregoing and in accordance with the purpose of the present invention, a method for forming semiconductor devices is provided. A gate stack is formed over a surface of a substrate. A plurality of cycles for forming polymer spacers on sides of the gate stack is provided, where each cycle comprises providing a deposition phase that deposits material on the sides of the polymer spacer and over the surface of the substrate, and providing a cleaning phase that removes polymer over the surface of the substrate and shapes a profile of the deposited material. Dopant is implanted into the substrate using the polymer spacers as a dopant mask. The polymer spacers are removed.

In another manifestation of the invention, a semiconductor is formed by the following method. A gate stack is formed over a surface of a substrate. A plurality of cycles for forming polymer spacers on sides of the gate stack is provided, where each cycle comprises providing a deposition phase that deposits material on the sides of the polymer spacer and over the surface of the substrate, and providing a cleaning phase that removes polymer over the surface of the substrate and shapes a profile of the deposited material. Dopant is implanted into the substrate using the polymer spacers as a dopant mask. The polymer spacers are removed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
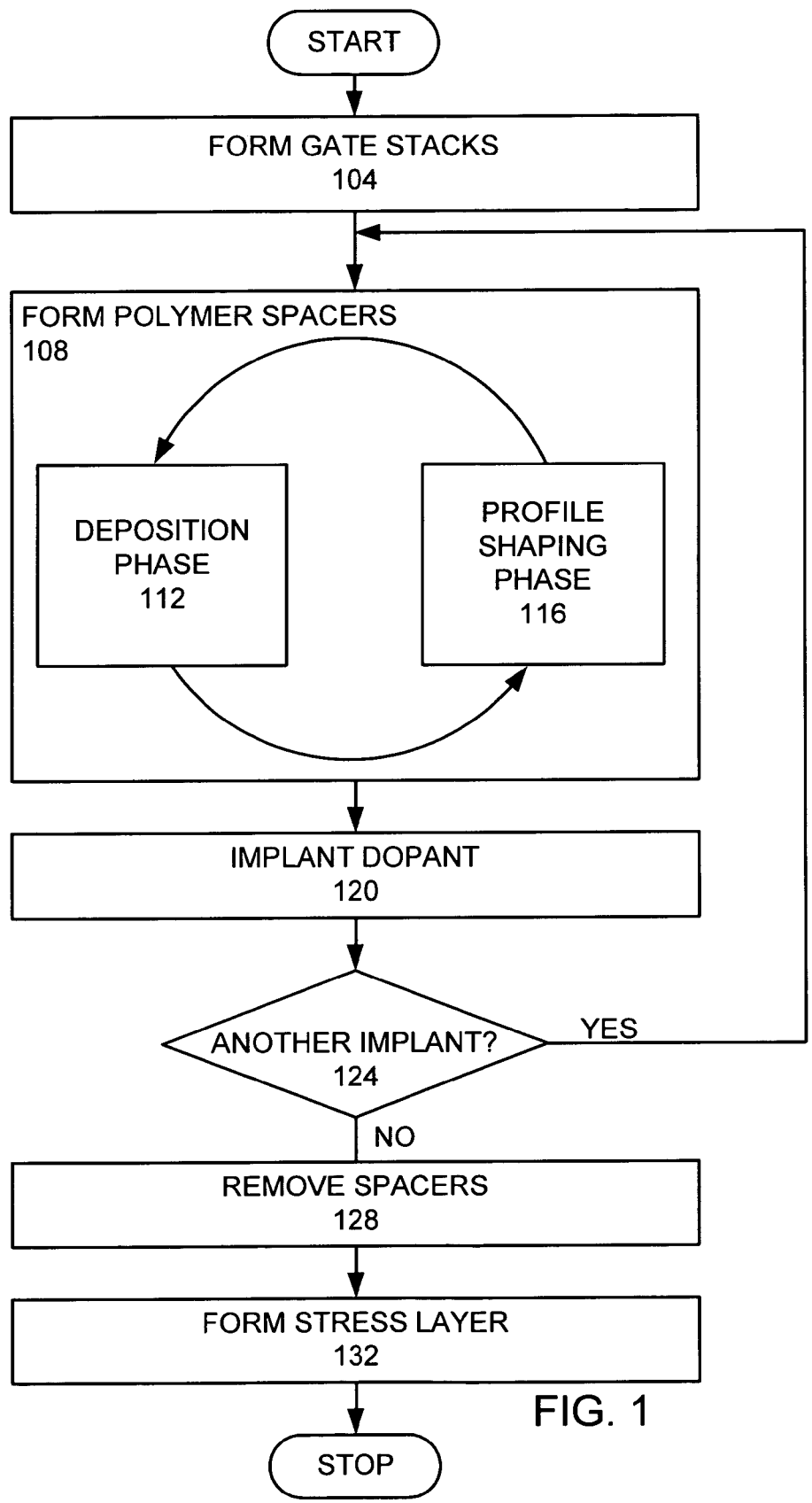
FIG. 1 is a high level flow chart of the formation of devices used in an embodiment of the invention.
Figure 2A:
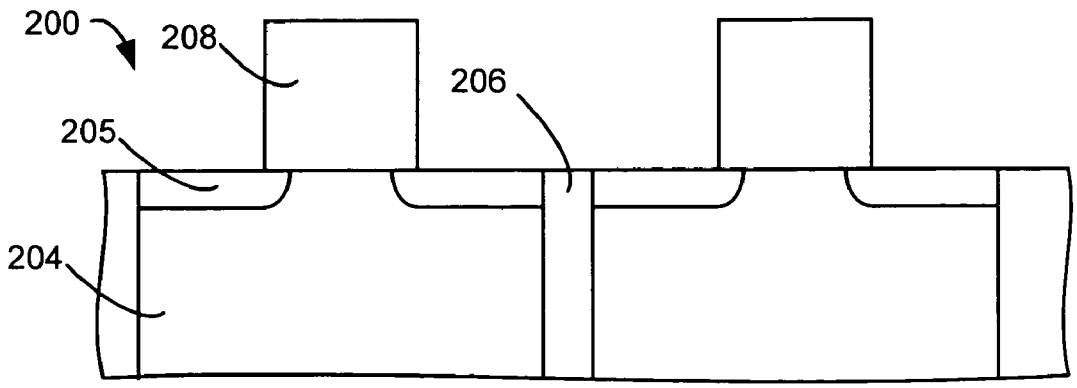
FIGS. 2A-I are schematic views of the formation of devices according to the embodiment shown in FIG. 1.

To facilitate understanding, FIG. 1 is a high level flow chart of a process used in an embodiment of the invention. Gate stacks are formed over a substrate (step 104). FIG. 2A is a cross-sectional view of an intermediate structure 200 with a substrate 204 over which gate stacks 208 have been formed. The substrate 204 has isolation regions 206. In addition, an ion dopant has been used to form lightly doped source and drain regions 205.

Figure 2B:
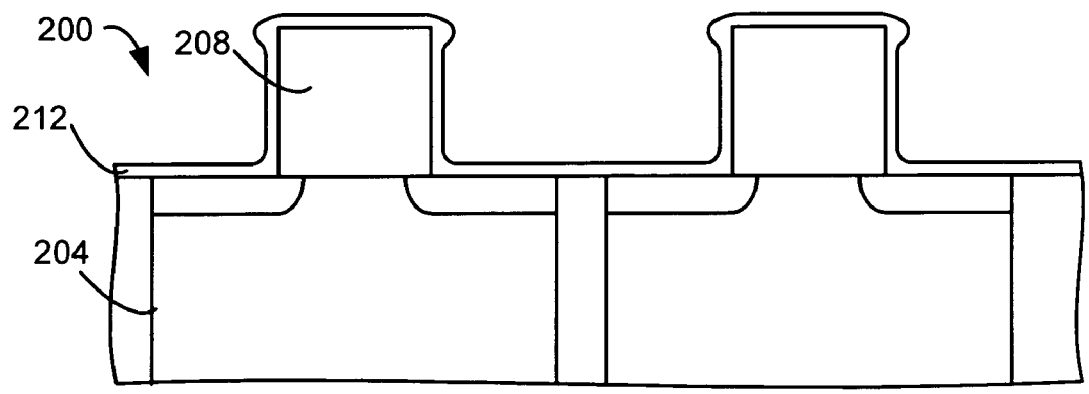

Polymer spacers are formed on the sides of the gate stack 208 (step 108). The polymer spacers are formed using a plurality of cycles where each cycle comprises a deposition phase (step 112) and a profile shaping phase (step 116). FIG. 2B is a cross-sectional view of the intermediate structure 200 after a first depositional phase (step 112) has provided a depositional layer 212. In this example, the deposition phase deposits material over the surface of the substrate. In addition, the deposition phase forms sidewalls that are not vertical. In this example, the sidewalls on the side of the gate stack are bread loafed forming thicker deposits at the very top of the gate stack. In addition, the sidewalls have a curved bottom.

Figure 2C:
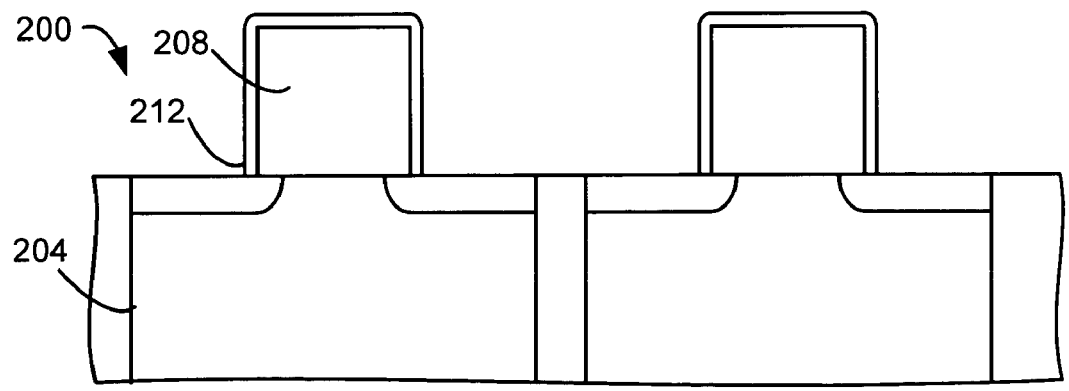

FIG. 2C is a cross-sectional view of the stack after a first profile shaping phase (step 116) has shaped the sidewalls. The profile shaping phase is used to remove the layer of material deposited over the substrate and forms the profile of the sidewalls. Preferably, the sidewalls are formed to vertical sidewalls. Vertical sidewalls are defined as sidewalls that from bottom to top make an angle between 88° to 90° with the substrate surface, as shown in FIG. 2C. The profile shaping phase may remove the layer of deposited material from over the top of the gate stack, or partially etch away some of the material, or leave the material deposited over the top of the gate stack 208.

Figure 2D:
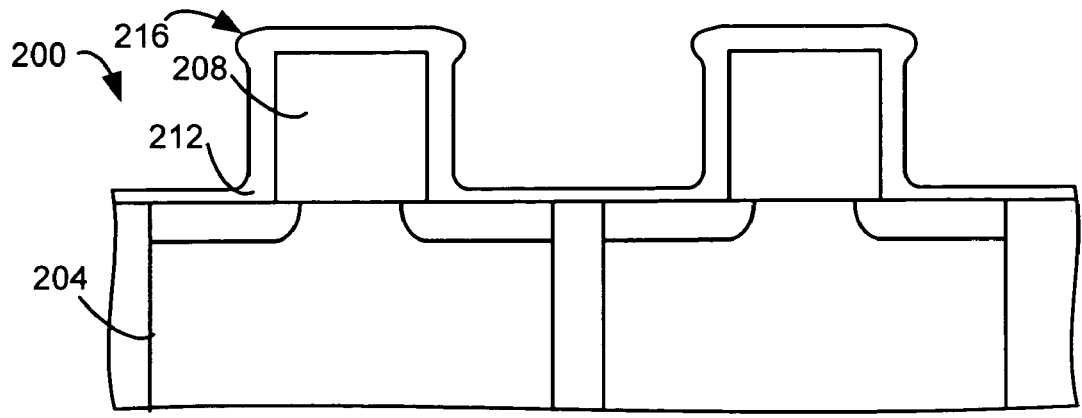

FIG. 2D is a cross-sectional view of the stack after a second depositional phase (step 112). The second deposition phase adds to the layer on the sidewalls and on top of the gate stack and forms new layers over the substrate. The second deposition also makes bread loaf features 216.

Figure 2E:
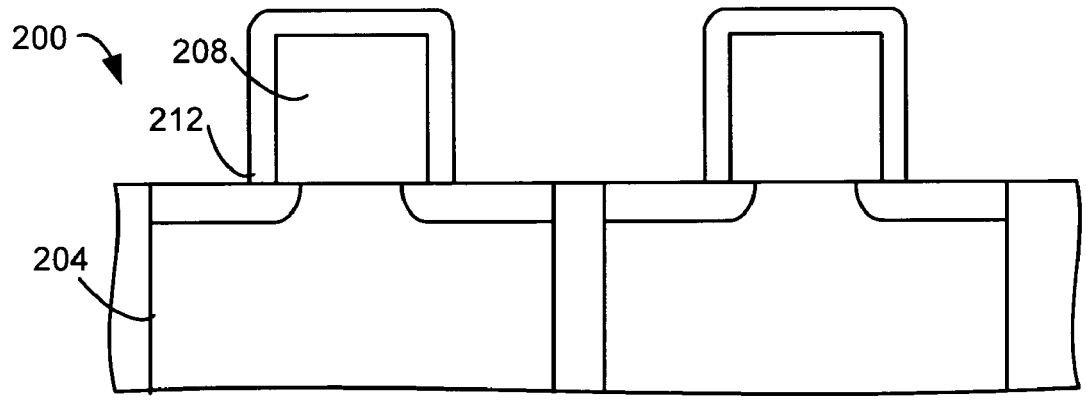

FIG. 2E is a cross-sectional view of the stack after a second profile shaping phase (step 116). The second profile shaping phase removes the layer of material over the substrate and forms the profile of the sidewalls, which again preferably forms vertical sidewalls. The vertical sidewalls may be twice as thick as the vertical sidewalls after the first profile shaping phase, since two depositions have been performed.

Figure 2F:
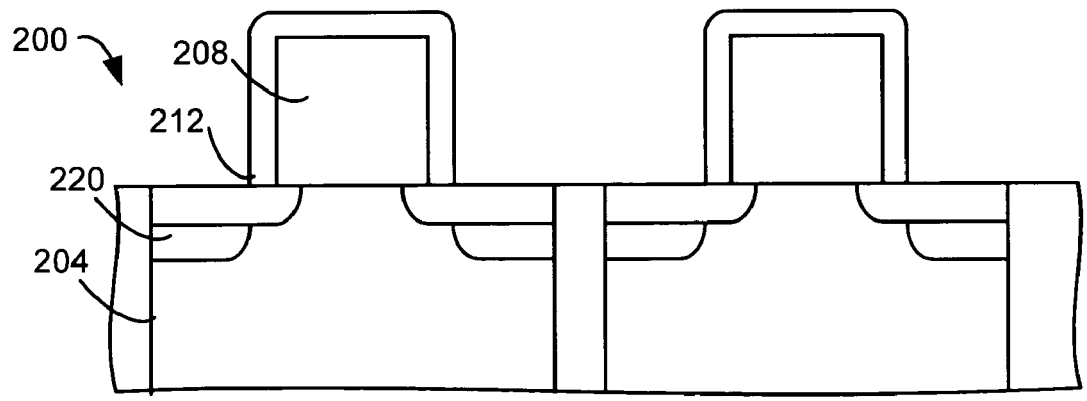

After a number of cycles, the sidewalls reach a desired thickness. Dopant is then implanted into the substrate 204 using the vertical sidewalls 212 as a mask, which forms heavily doped source and drain regions 220, as shown in FIG. 2F.

Figure 2G:
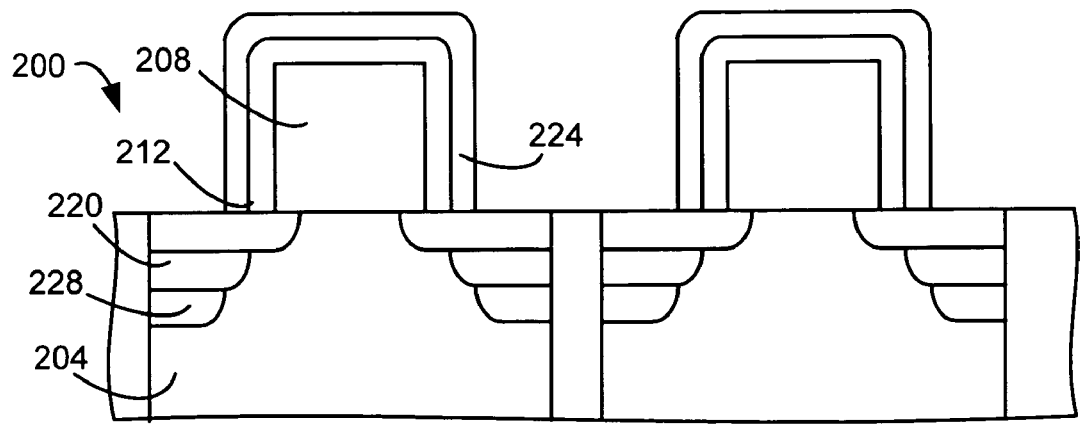

A determination is made if another implant is required (step 124). If an additional implant is required, additional polymer spacers are formed (step 108) by performing a plurality of cycles where each cycle comprises a deposition phase (step 112) and a profile shaping stage (step 116). FIG. 2G is a cross-sectional view of the intermediate structure 200 after additional sidewalls 224 are formed by a plurality of cycles where each cycle comprises a deposition phase (step 112) and a profile shaping phase (step 116). Another ion implant is formed creating more heavily doped source and drain regions 228 (step 124).

Figure 2H:
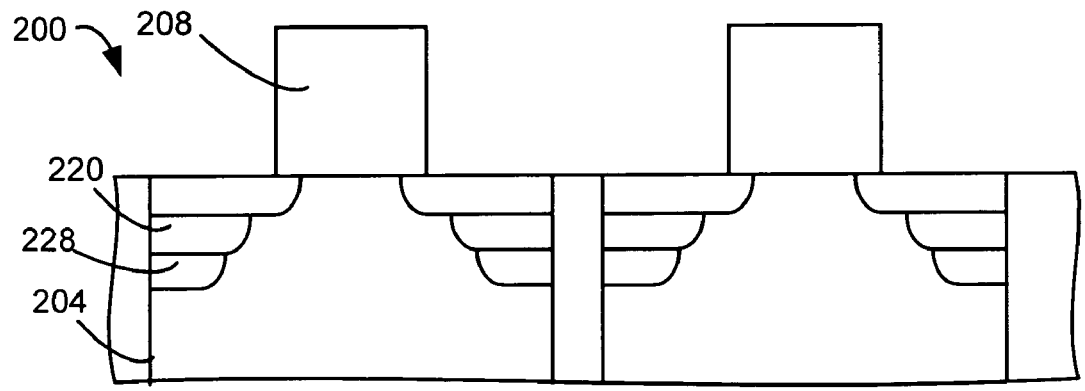

The spacers are removed (step 128), as shown in FIG. 2H. Because the spacers are of a polymer material, a polymer strip, such as an ashing, may be used to remove the spacers.

For an L shaped spacer, the polymer top layer that defines the L can be removed with a polymer strip leaving the dielectric underlayer intact.

Figure 2I:
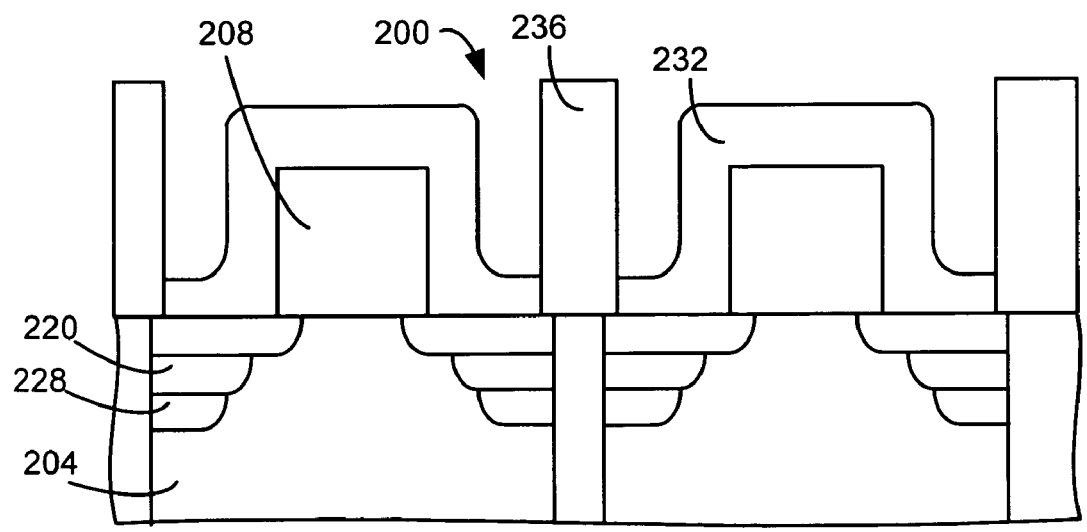

At least one stress layer 232 is formed over the substrate and gate stack (step 132), as shown in FIG. 2I. Contacts 236 may also be added. The stress layer 232 may be a tensile stress layer for a NMOS device to increase the NMOS drive current or may be a compressive stress layer for a PMOS device to increase the PMOS drive current.

Forming the spacers from a polymer allows an easy removal of the spacer, which allows the deposition of a more effective stress layer. In addition, the multi cycle process provides more vertical sidewalls, which improves implantation. The multicycle process also minimizes or eliminates deposition over the substrate, so that a separate breakthrough is not needed. The multicycle process also provides better deposition when gates are placed close together for higher density structures.

EXAMPLE

In an example of the invention, gates stacks are formed over a substrate (step 104). In this example, the gate stacks 208 comprise a polysilicon, metal, or silicide over an oxide layer. The substrate 204 may be a semiconductor layer, such as a silicon wafer or polysilicon layer. The isolation regions 206 may be a silicon oxide region formed using conventional shallow trench isolation processes. The lightly doped source and drain regions 205 are formed using ion implantation. In this example, the doping is done so that one of the gate stacks 208 is used to form a NMOS transistor and another of the gate stacks 208 is used to form a PMOS transistor.

Polymer spacers are formed on the sidewalls of the gate stacks 208 (step 108). In this example, to form the polymer spacers as sidewalls to the gate stack 208, the substrate 204 is placed in a plasma processing chamber.

Figure 3:
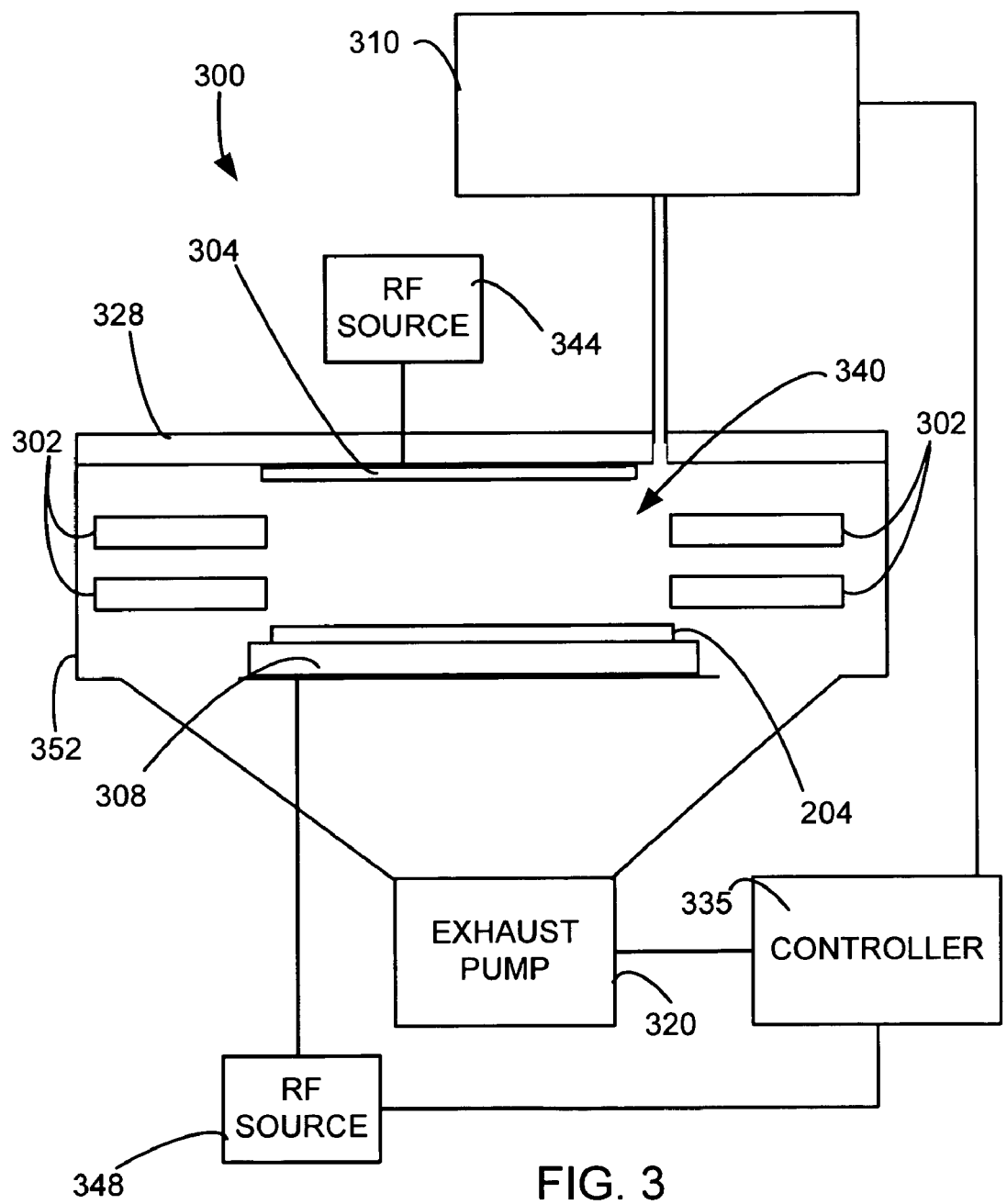
FIG. 3 is a schematic view of a plasma processing chamber that may be used for etching and stripping.

FIG. 3 is a schematic view of a plasma processing chamber 300 that may be used for etching and stripping. The plasma processing chamber 300 comprises confinement rings 302, an upper electrode 304, a lower electrode 308, a gas source 310, and an exhaust pump 320. The gas source 310 may comprise a deposition gas source and a profile shaping phase gas source. Within plasma processing chamber 300, the substrate 204 is positioned upon the lower electrode 308. The lower electrode 308 incorporates a suitable substrate chucking mechanism (e.g., electrostatic, mechanical clamping, or the like) for holding the substrate 204. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by the gas source 310 and is exhausted from the confined plasma volume through the confinement rings 302 and an exhaust port by the exhaust pump 320. A first RF source 344 is electrically connected to the upper electrode 304. A second RF source 348 is electrically connected to the lower electrode 308. Chamber walls 352 surround the confinement rings 302, the upper electrode 304, and the lower electrode 308. Both the first RF source 344 and the second RF source 348 may comprise a 27 MHz power source, a 60 MHz power source, and a 2 MHz power source. Different combinations of connecting RF power to the electrode are possible. In a preferred embodiment of the invention, the 27 MHz, 60 MHz, and 2 MHz power sources make up the second RF power source 348 connected to the lower electrode, and the upper electrode is grounded. A controller 335 is controllably connected to the RF sources 344, 348, exhaust pump 320, and the gas source 310. Such a device is capable of modulating the pressure of the chamber, gas flow, gas combinations, RF power, and time duration for each phase.

Figure 4A:
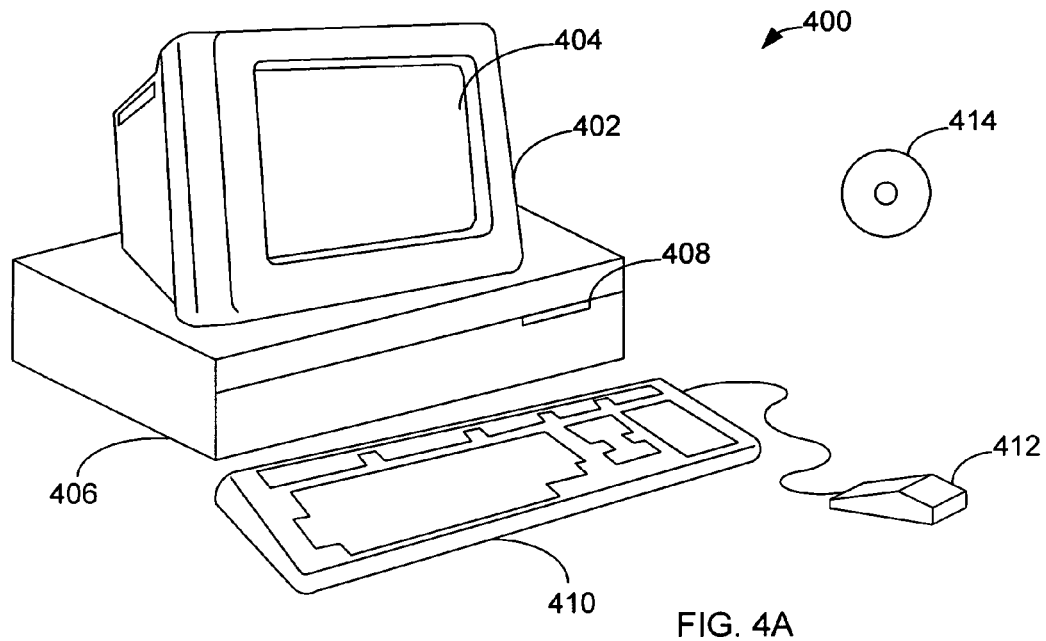
FIGS. 4A-B illustrate a computer system, which is suitable for implementing a controller used in embodiments of the present invention.
Figure 4B:
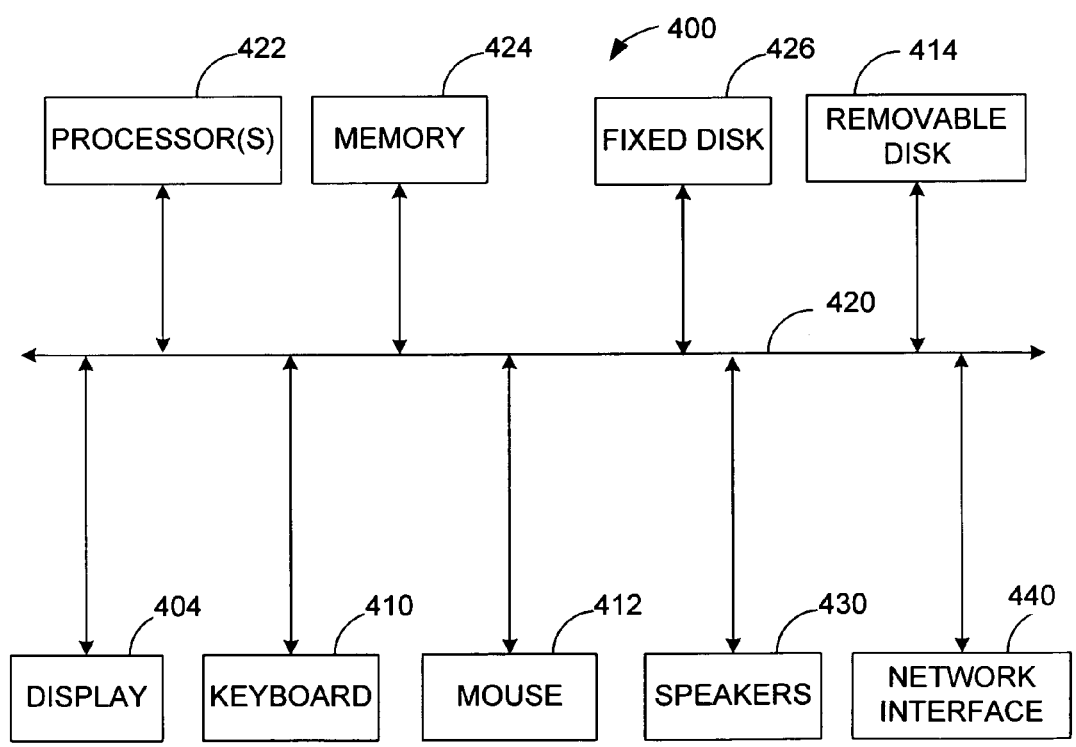

FIGS. 4A and 4B illustrate a computer system 400, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 are a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The polymer spacers are formed in the process chamber 300. An example recipe for the deposition phase (step 112) provides a pressure of 140 mTorr. The second RF power source provides 800 Watts at 27 MHz. A deposition gas of 360 sccm $CH_3F$ and 180 sccm $N_2$ is provided. The power transforms the deposition gas into a plasma. The deposition gas is then stopped after a period of time. An example recipe for the profile shaping phase (step 116) provides a chamber pressure of 120 mTorr. The second RF power source provides 1600 Watts at 27 MHz. A profile shaping gas of 472 sccm $CF_4$ is provided. The power transforms the profile shaping gas into a plasma. The profile shaping gas is then stopped after a period of time.

Preferably, the forming of the polymer spacers comprises at least 3 cycles. More preferably, the forming the polymer spacers comprises 1~20 cycles.

Dopant is implanted (step 120) using the sidewall spacers as masks. Conventional ion implants may be used where polymer spacers are used as masks. The formation of polymer spacers and ion implant may be performed one or more times (step 124).

The polymer spacers are removed (step 128). In this example, the recipe for removing the spacers provides a chamber pressure of 280 mTorr. The second power source provides 300 Watts at 27 MHz and 200 Watts at 2 MHz. A stripping gas of 1500 sccm $O_2$ is provided. The $O_2$ gas is converted to a plasma by the power from the power source. The plasma is used to remove the polymer spacers. The process is then stopped.

A stress layer 132 is formed over the substrate 204 and gate stack 208. For the NMOS transistor, a tensile nitride film may be provided which improves performance by improving charge carrier mobility and velocity in the channel region. For the PMOS transistor, a compressive nitride film may be provided that causes compression stress, which improves performance by improving charge carrier mobility and velocity in the channel region. These stress layers may be used as etch stops for additional layers over the CMOS devices.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for forming semiconductor devices, comprising:
    forming a gate stack over a surface of a substrate;
    providing a plurality of cycles for forming polymer spacers on sides of the gate stack, wherein each cycle comprises:
        providing a deposition phase that deposits material on the sides of the polymer spacer and over the surface of the substrate; and
        providing a cleaning phase that removes polymer over the surface of the substrate and shapes a profile of the deposited material;
    implanting dopant into the substrate using the polymer spacers as a dopant mask; and
    removing the polymer spacers.

2. The method, as recited in claim 1, further comprising placing at least one stress layer over the semiconductor devices after the polymer spacers are removed.

3. The method, as recited in claim 2, further comprising forming additional spacers after implanting dopant into the substrate and implanting additional dopant into the substrate after forming the additional spacers.

4. The method, as recited in claim 3, wherein the providing the plurality of cycles for forming polymer spacers provides at least 3 cycles.

5. The method, as recited in claim 4, further comprising
    providing an additional plurality of cycles for forming polymer spacers on sides of the gate stack after implanting the dopant into the substrate, wherein each cycle comprises:
        providing a deposition phase that deposits material on the sides of the polymer spacer and over the surface of the substrate; and
        providing a cleaning phase that removes polymer over the surface of the substrate and shapes a profile of the deposited material;
    implanting additional dopant into the substrate after providing the additional plurality of cycles for forming polymer spacers.

6. The method, as recited in claim 5, wherein the providing the plurality of cycles for forming polymer spacers forms polymer spacers that form vertical sidewalls around the gate stack.

7. The method, as recited in claim 6, wherein the removing the polymer spacers comprises providing an oxygen ashing.

8. The method, as recited in claim 6, wherein the removing the polymer spacers comprises providing an ashing.

9. The method, as recited in claim 1, further comprising forming additional spacers after implanting dopant into the substrate and implanting additional dopant into the substrate after forming the additional spacers.

10. The method, as recited in claim 1, wherein the providing the plurality of cycles for forming polymer spacers provides at least 3 cycles.

11. The method, as recited in claim 1, further comprising
    providing an additional plurality of cycles for forming polymer spacers on sides of the gate stack after implanting the dopant into the substrate, wherein each cycle comprises:
        providing a deposition phase that deposits material on the sides of the polymer spacer and over the surface of the substrate; and
        providing a cleaning phase that removes polymer over the surface of the substrate and shapes a profile of the deposited material;
    implanting additional dopant into the substrate after providing the additional plurality of cycles for forming polymer spacers.

12. The method, as recited in claim 1, wherein the providing the plurality of cycles for forming polymer spacers forms polymer spacers that form vertical sidewalls around the gate stack.

13. The method, as recited in claim 12, wherein the removing the polymer spacers comprises providing an oxygen ashing.

14. The method, as recited in claim 1, wherein the removing the polymer spacers comprises providing an oxygen ashing.

15. A semiconductor device formed by the method of claim 1.

16. A semiconductor device formed by the method, comprising:

forming a gate stack over a surface of a substrate;

providing a plurality of cycles for forming polymer spacers on sides of the gate stack, wherein each cycle comprises:

providing a deposition phase that deposits material on the sides of the polymer spacer and over the surface of the substrate; and providing a cleaning phase that removes polymer over the surface of the substrate and shapes a profile of the deposited material;

implanting dopant into the substrate using the polymer spacers as a dopant mask; and removing the polymer spacers.

17. The semiconductor device, as recited in claim 16, further comprising placing at least one stress layer over the semiconductor devices after the polymer spacers are removed.

18. The semiconductor device, as recited in claim 17, further comprising forming additional spacers after implanting dopant into the substrate and implanting additional dopant into the substrate after forming the additional spacers.

19. The semiconductor device, as recited in claim 16, further comprising providing an additional plurality of cycles for forming polymer spacers on sides of the gate stack after implanting the dopant into the substrate, wherein each cycle comprises:

providing a deposition phase that deposits material on the sides of the polymer spacer and over the surface of the substrate; and providing a cleaning phase that removes polymer over the surface of the substrate and shapes a profile of the deposited material;

implanting additional dopant into the substrate after providing the additional plurality of cycles for forming polymer spacers.

* * * * *